United States Patent
Voyer et al.

(10) Patent No.: US 10,333,385 B2
(45) Date of Patent: Jun. 25, 2019

(54) METHOD AND DEVICE FOR CONTROLLING THE OPERATION OF MULTI-DIE POWER MODULE

(71) Applicant: MITSUBISHI ELECTRIC CORPORATION, Tokyo (JP)

(72) Inventors: Nicolas Voyer, Rennes (FR); Jeffrey Ewanchuk, Rennes (FR); Stefan Mollov, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/069,845

(22) PCT Filed: Feb. 7, 2017

(86) PCT No.: PCT/JP2017/005029
§ 371 (c)(1),
(2) Date: Jul. 12, 2018

(87) PCT Pub. No.: WO2017/141841
PCT Pub. Date: Aug. 24, 2017

(65) Prior Publication Data
US 2019/0020260 A1    Jan. 17, 2019

(30) Foreign Application Priority Data

Feb. 16, 2016  (EP) .................................... 16155848

(51) Int. Cl.
*H02M 1/088*  (2006.01)
*H02M 1/32*  (2007.01)
(Continued)

(52) U.S. Cl.
CPC ............. *H02M 1/088* (2013.01); *H02M 1/32* (2013.01); *H03K 17/08* (2013.01); *H03K 17/12* (2013.01); *H03K 17/14* (2013.01)

(58) Field of Classification Search
CPC ........ H02M 1/088; H02M 1/32; H03K 17/08; H03K 17/12; H03K 17/14; H03K 17/082
See application file for complete search history.

(56) References Cited

U.S. PATENT DOCUMENTS 7,992,020 B1 *  8/2011  Tuan .................... G06F 1/3203
                                                        713/320
9,030,155 B1 *  5/2015  Li ......................... H02J 7/0003
                                                        320/107

(Continued)

OTHER PUBLICATIONS

International Search Report, issued in PCT/JP2017/005029, dated May 11, 2017.

(Continued)

*Primary Examiner* — Adolf D Berhane
(74) *Attorney, Agent, or Firm* — Birch, Stewart, Kolasch & Birch, LLP

(57) ABSTRACT

The present invention concerns a method for controlling the operation of a multi-die power module composed of at least two dies connected in parallel. The method comprises the steps of: —obtaining the current flowing in the multi-die power module, —obtaining a loss profile that is related to the dies of the multi-die power module, —estimating from the measured current flowing in the multi-die power module, the losses of one die when no die is passivated, when the die is passivated, and when at least one other die is passivated, —determining if and which die has to be passivated from the estimated losses and from the loss profile—passivating the die which has to be passivated if a die has to be passivated.

15 Claims, 6 Drawing Sheets

(51) Int. Cl.
*H03K 17/08* (2006.01)
*H03K 17/12* (2006.01)
*H03K 17/14* (2006.01)

(56) References Cited

U.S. PATENT DOCUMENTS

| | | | | |
|---|---|---|---|---|
| 2014/0035548 | A1* | 2/2014 | Oaklander | H03K 17/063 |
| | | | | 323/283 |
| 2017/0327001 | A1* | 11/2017 | Lu | B60L 3/003 |
| 2018/0026623 | A1* | 1/2018 | Cairoli | H03K 17/0822 |
| | | | | 361/89 |
| 2018/0372553 | A1* | 12/2018 | Ewanchuk | G01K 13/00 |

OTHER PUBLICATIONS

Written Opinion of the International Searching Authority, issued in PCT/JP2017/005029, dated May 11, 2017.

* cited by examiner

METHOD AND DEVICE FOR CONTROLLING THE OPERATION OF MULTI-DIE POWER MODULE

TECHNICAL FIELD

The present invention relates generally to a system and a method for controlling the operation of a multi-die power module.

BACKGROUND ART

Multi-die power modules are classically composed of several parallel connected power dies and are used for increasing the current capability over that of a single power die.

For example, a three-phase converter is composed of four parallel power dies per switch, giving twenty four power dies in total.

Emerging devices technologies, such as SiC (Silicon Carbide) and GaN (Gallium Nitride) Transistors, are typically realized in high current density, small power dies due to limitations of yield and cost of wafer substrate.

In order to realize higher power SiC-based modules, a multitude of parallel connected SiC dies is necessary. Unlike parallel connected modules, parallel connected dies constitute a single switch that ideally commutates the same load current.

SUMMARY OF INVENTION

Technical Problem

However, regardless of the type of die used, i.e. diodes or voltage-driven switch, e.g. MOSFETs (Metal Oxide Semiconductor Field Effect Transistor), characteristics exist within the dies that limit the balanced sharing of the load current both statically and dynamically.

The temperature of each die within the multi-die power module is influenced by its geometric location on the substrate. Such temperature difference does not result in full utilization of the die, and thus, more dies are needed in parallel to achieve a given current rating, thereby increasing the overall costs and physical surface area of the power module.

Furthermore, energy losses during switching are influenced by the current going through the dies.

Solution to Problem

The present invention aims at enhancing the balancing of the temperature of the dies and then to increase the maximum capability of a multi-die power module without need to implement highly dynamic control.

To that end, the present invention concerns a method for controlling the operation of a multi-die power module composed of at least two dies connected in parallel, characterized in that the method comprises the steps of:
  obtaining the current flowing in the multi-die power module,
  obtaining a loss profile that is related to the dies of the multi-die power module,
  estimating from the measured current flowing in the multi-die power module, the losses of one die when no die is passivated, when the die is passivated, and when at least one other die is passivated,
  determining if and which die has to be passivated from the estimated losses and from the loss profile,
  passivating the die which has to be passivated if a die has to be passivated.

The present invention concerns also a device for controlling the operation of a multi-die power module composed of at least two dies connected in parallel, characterized in that the device comprises:
  means for obtaining the current flowing in the multi-die power module,
  means for obtaining a loss profile that is related to the dies of the multi-die power module,
  means for estimating from the measured current flowing in the multi-die power module, the losses of one die when no die is passivated, when the die is passivated, and when at least one other die is passivated,
  means for determining if and which die has to be passivated from the estimated losses and from the loss profile,
  means for passivating the die which has to be passivated if a die has to be passivated.

Thus, as a die is passivated, losses are unbalanced across dies, and the realised profile of die losses can be steered towards the loss profile that is related to the dies of the multidie power module. As a result, the temperature of dies can get better balanced, resulting in similar wear across dies. The lifetime of the multi-die power module is improved.

As die losses are estimated according to the passivation state of the multi-die power module and according to the current flowing in the multi-die power module, the estimation of losses is accurate and the effect of passivation can be accurately steered towards the loss profile that is related to the dies of the multi-die power module. The steering is realised in a slow closed-loop way. Only one current sensor is needed and the measurement is slow. Temperature balancing across dies is realised at low cost since both acquisition and control circuits have low complexity.

According to a particular feature, the determining step further comprises sub steps of:
  determining if the die which has to be passivated shall be partially passivated or fully passivated,
  fully passivating the die which has to be passivated by keeping the die in off state if the die which has to be passivated shall be fully passivated,
  partially passivating the die which has to be passivated by activating the die which has to be passivated during a smaller period than other dies.

Thus, the realized profile of die losses is steered faster towards the loss profile that is related to the dies of the multi-die power module, as effect of full passivation reduces conduction losses in addition to switching losses. On the other hand, full passivation of a die may increase total losses of the multi-die power module compared with partial passivation. The control of the multi-die power module is thus given better controllability to trade for speed and effectiveness of convergence and for minimization of losses.

According to a particular feature, the losses of the die are the sum of the conduction loss and of the switching loss of the die, which are determined from the current flowing in the multi-die power module and from the passivation status of dies of the multi-die power module.

Thus, the behavior of die losses resulting from different passivation choice and from different current level is well described. As a result, the steering of the realized loss profile towards the desired loss profile is effective.

According to a particular feature, the switching losses are null if the die is passivated, the conduction losses are null if the die is fully passivated, the switching losses are equally shared across the dies which are not passivated and the conduction losses are equally shared across the dies which are not fully passivated.

Thus, the effect of passivation of one die on the losses of other dies is straightforward.

According to a particular feature, the method comprises further step of obtaining the temperature of the multi-die power module and the estimated losses are further dependent of the obtained temperature.

Thus, the determination of losses can be varied according to usage of the multi-die power module. The proportion of estimated conduction and switching losses can be varied with temperature in an accurate way.

According to a particular feature, the determining if and which die has to be passivated from the estimated losses and from the loss profile further comprises step of:

determining a passivation pattern for at least one die from the estimated losses and from the loss profile, and the step for passivating the die which has to be passivated is performed according to the determined passivation pattern.

Thus, the passivation pattern covers a series of consecutive activation cycles, with a predetermined passivation status at each activation cycle. Passivation pattern can be played in an open loop way until measured current varies. The control of the multi-die power module is realized at low complexity and cost.

According to a particular feature, the method comprises further step of obtaining a first matrix that relates the losses of dies to the passivation states of the multi-die power module using the estimated losses of one die when no die is passivated, when the die is passivated, and when at least one other die is passivated and the passivation pattern is determined from the obtained first matrix and the loss profile.

Thus, the decision of passivation pattern is determined from an accurate estimation of losses, resulting from the choice of the passivation pattern.

According to a particular feature, the obtained first matrix is obtained from a lookup table stored in a memory.

Thus, impact of die passivation on the losses of each other dies is accurate, even in presence of mismatched dies and evolving current waveform.

According to a particular feature, that the passivation pattern is determined by a vector obtained as the product of the inverse of the first matrix with the loss profile, the k-th component of the obtained vector defining the ratio of activation cycles where the k-th die shall be not passivated.

Thus, the passivation pattern is easily determined. The number of passivation cycles in the passivation pattern is directly determined for each die of the multi-die power module.

According to a particular feature, if the k-th component of the obtained vector is negative, the method further comprising the steps of:

obtaining a second matrix that relates the losses of dies to the passivation states of the multi-die power module, using the estimated losses of one die when no die is passivated, when the die is passivated, and when at least one other die is passivated, the k-th die being fully passivated, and the passivation pattern being determined from the obtained second matrix and the loss profile.

Thus, the determination of full passivation of the die is clearly determined. Full passivation is more effective in steering the realized loss profile towards the desired loss profile, especially in situations where switching losses are small compared with conduction losses.

According to a particular feature, the step for determining if and which die has to be passivated from the estimated losses and from the loss profile further comprises sub steps of:

memorising the estimated losses and information indicating if the die was previously passivated, estimating an accumulation of heat level dissipated by each die of the multi-die power module according to memorised estimated loss and information, and the step of determining if and which die has to be passivated is performed from the estimated accumulation of heat levels and from the loss profile.

Thus, the steering of accumulated heat levels dissipated by each die towards the desired loss profile is effective and updates every activation cycle.

Compared with using passivation patterns, the solution can better react to fast evolving current waveforms.

According to a particular feature, a ratio between the estimated accumulation of heat level and the loss profile is determined for each die and the die which has the highest ratio is determined as to be passivated if the ratio exceeds a predetermined value.

Thus, the determination of which die shall be passivated is easy and is realized at every activation cycle. The steering is effective, as the die which has the highest ratio has been dissipating too much heat compared to its neighbors. Choosing this die for passivation is an effective way of reducing the dissipated heat level of that die in proportion to that of other dies.

According to a particular feature, the die ratio is determined as to be fully passivated if the ratio exceeds a second predetermined value.

Thus, the determination of full passivation instead of partial passivation is easy. By means of full activation, the controller can limit overheat situations that otherwise would have led to undesired wear of the die.

According to a particular feature, the loss profile is obtained by determining if the current flowing in the multi-die power module crosses zero and if the current flowing in the multi-die power module crosses zero, the method further comprises the step of:

determining a third matrix, which relates the losses of the dies to the temperature of the dies, the matrix being dependent of the current flowing in the multi-die power module and the frequency of the crossing of the current flowing in the multi-die power module to zero and the loss profile is obtained by determining a vector of loss profile according to the third matrix and a balanced temperature profile.

Thus, the loss profile can be adapted with the fundamental frequency of the current waveform which flows through the multi-die power module. The response of the thermal network surrounding dies varying with heat pulsation frequency, the control can better steer the realized loss profile to a loss profile that effects in getting a balanced temperature profile for the current waveform at given fundamental frequency.

The characteristics of the invention will emerge more clearly from a reading of the following description of example embodiments, the said description being produced with reference to the accompanying drawings.

DESCRIPTION OF EMBODIMENTS

Figure 1:
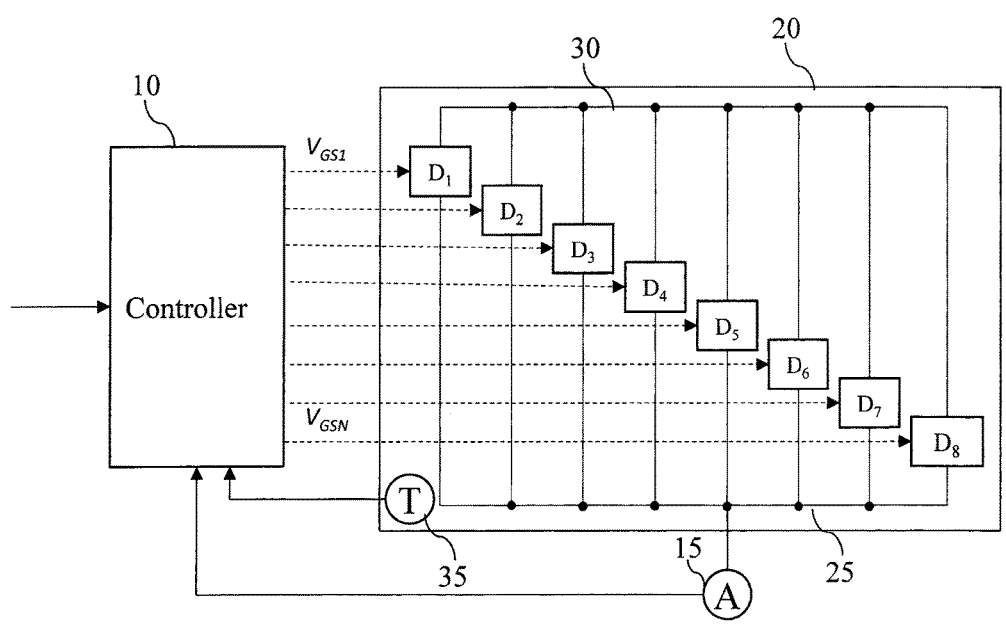
FIG. 1 represents an example of a system for controlling the operation of a multi-die power module according to the present invention.

FIG. 1 represents an example of a system for controlling the operation of a multi-die power module according to the present invention.

The system for controlling the operation of a multi-die power module 20 comprises a controller 10 and a current sensor 15.

The multi-die power module 20 is for example composed of eight dies noted $D_1$ to $D_8$.

The controller 10 receives, from a host controller not shown in FIG. 1, an input control signal to be applied to the multi-die power module 20 and modifies it according to the current value sensed by the current sensor 15, the operating frequency of the input control signal, the duty cycle of the input control signal, a predetermined loss profile stored in the memory of the controller and eventually a table stored in the memory of the controller 10 and containing activation patterns for each die as it will be disclosed hereinafter.

As example, the input signal is modified by skipping at least one activation period so that the die controlled by the modified signal does not experience conduction and switching losses, realising full passivation of the die, or the signal is modified by shortening the activation period so that the die controlled by the modified signal experiences less switching losses, realising partial passivation of the die.

For each die, the controller 10 provides a Gate to Source signal noted $V_{GS1}$ to $V_{GSN}$, where N is the number of dies of the multi-die power module 20, for driving each die according to the activation pattern and to the input control signal. In the example of FIG. 1, N is equal to eight.

The dies $D_1$ to $D_8$ are connected in parallel, the drains or the collectors 30 of the dies $D_1$ to $D_8$ are connected together and the sources or the emitters 25 of the dies $D_1$ to $D_8$ are connected together.

The current sensor 15 senses the sum of the currents going through the dies $D_1$ to $D_8$ and provides a current value to the controller 10.

Despite the addition of current sensor 15, the present invention keeps low cost as the current sensor 15 doesn't require high acquisition speed, nor high accuracy and because a single current sensor 15 is used.

According to a particular mode of realization of the present invention, the multi-die power module 20 further comprises a temperature sensor 35 which senses the substrate temperature of the multi-die power module 20.

Figure 2:
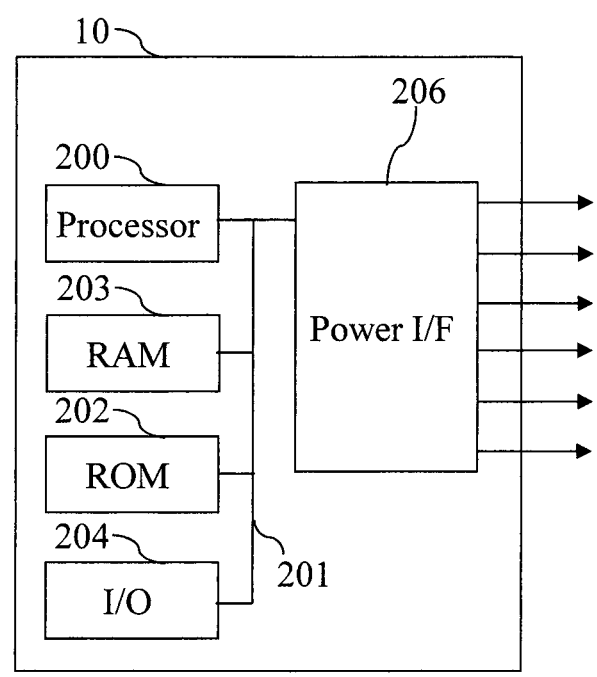
FIG. 2 represents an example of a controller for controlling the operation of a multi-die power module according to the present invention.

FIG. 2 represents an example of a controller for controlling the operation of a multi-die power module according to the present invention.

The controller 20 has, for example, an architecture based on components connected together by a bus 201 and a processor 200 controlled by a program in order to adjust Gate to Source signals $V_{GS1}$ to $V_{GSN}$ to be provided for the dies.

The bus 201 links the processor 200 to a read only memory ROM 202, a random access memory RAM 203, an Input/Output interface 204 and a power interface 206.

The memory 203 contains registers intended to receive variables, the activation pattern of the different dies and a loss profile vector Q that is representative of a distribution of losses within the multi-die power module.

Figure 3:
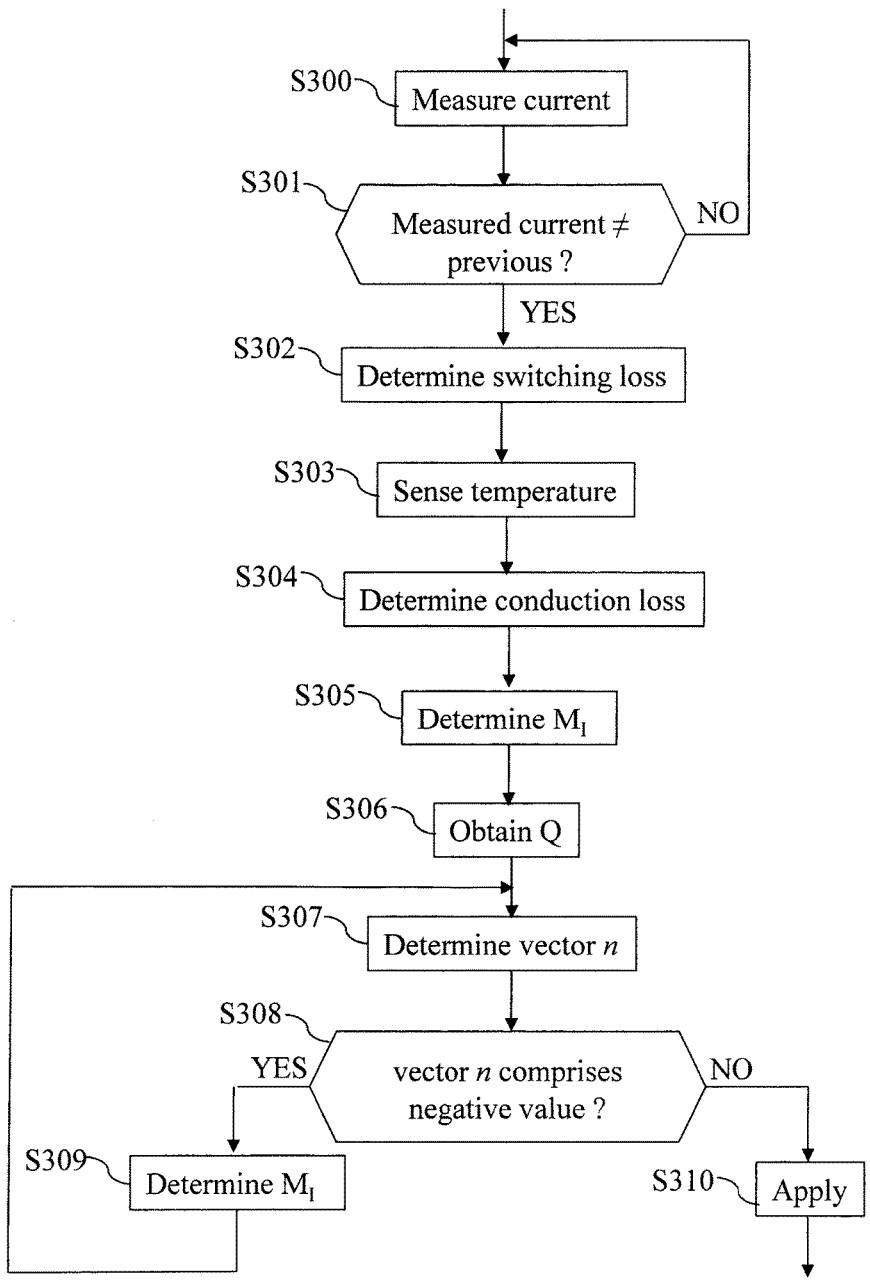
FIG. 3 represents a first algorithm for determining power patterns for controlling the operation of a multi-die power module according to the present invention.
Figure 6:
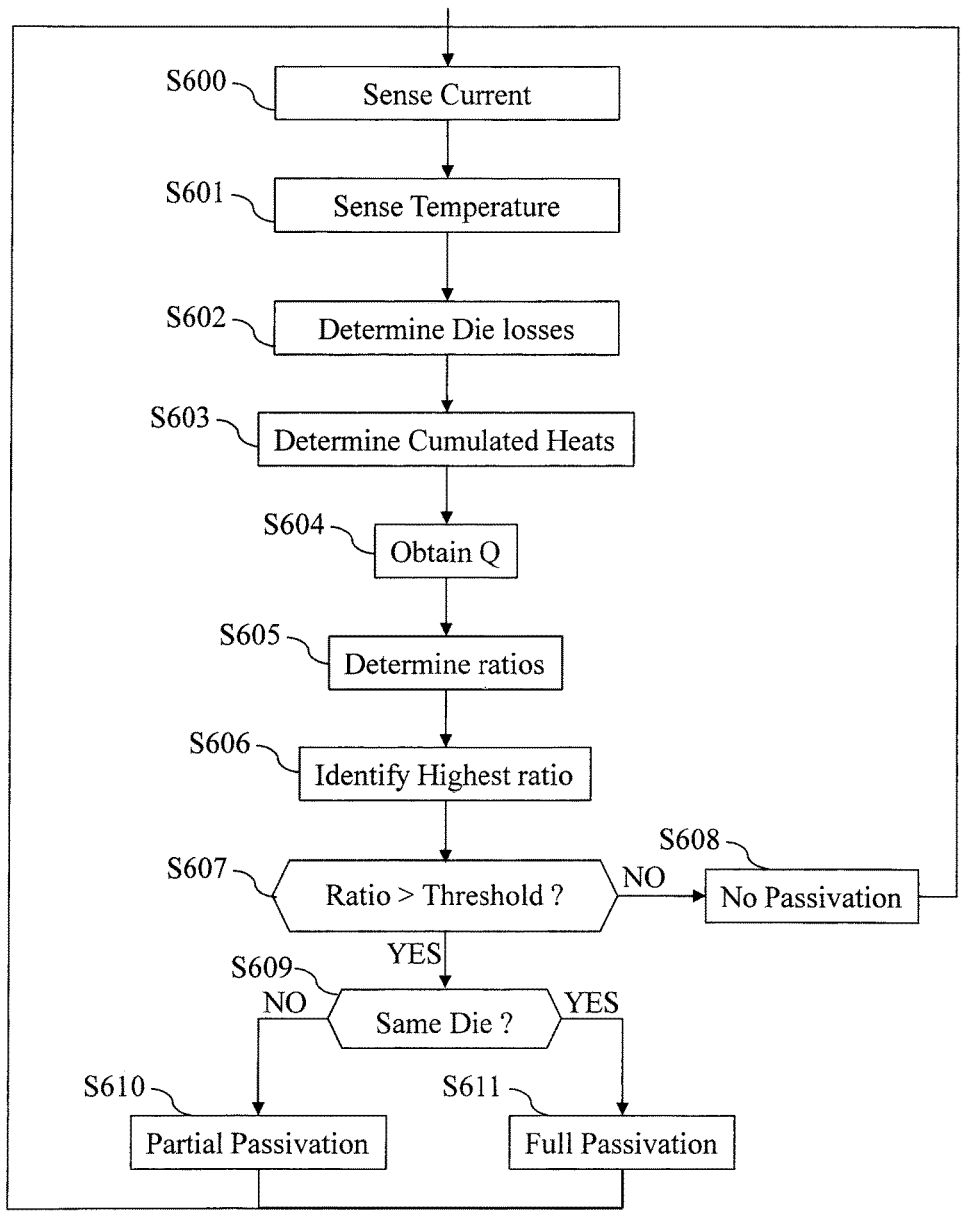
FIG. 6 represents a second algorithm for determining power patterns for controlling the operation of a multi-die power module according to the present invention.
Figure 7:
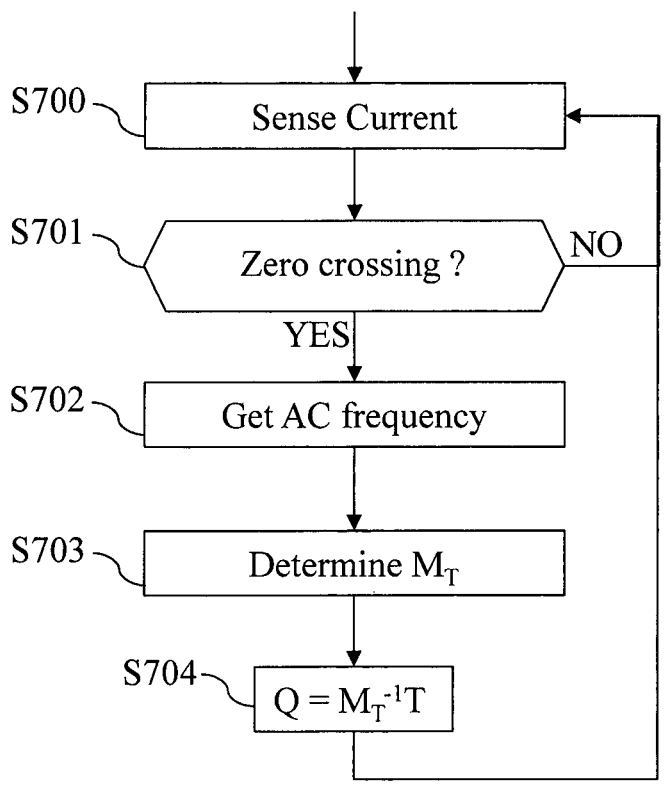
FIG. 7 represents an algorithm for determining loss profile Q.

If the activation patterns are determined in real time, the memory 203 contains the instructions of the program related to the algorithm as disclosed in FIG. 3, FIG. 6 and/or FIG. 7.

The processor 200 receives an input gate signal pattern to be applied to the multi-die power module 20 and determines, for each activation cycle of the input control signal and for each die, the activation of the dies according to the activation pattern.

The read only memory 202 contains instructions of the programs related to the algorithm disclosed in FIG. 3, FIG. 6 and/or FIG. 7, which are transferred, when the controller 20 is powered on, to the random access memory 203.

The controller 20 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the controller 10 includes circuitry, or a device including circuitry, causing the controller 10 to perform the algorithms disclosed in FIG. 3, FIG. 6 and/or FIG. 7.

The controller 10 may be realized, for example, by a pre-programmed CPLD (Complex Programmable Logic Device).

The Input/Output interface 204 receives input control signal, sensing information from current sensor 15 and from Temperature sensor 35, lookup tables, and loss distribution profile Q.

For each power die and for each activation cycle of the input control signal, the power interface 206 converts the input control signal into gate to source voltage signal $V_{GS1}$ to $V_{GSN}$, according to the passivation pattern of the die determined by the processor 200.

FIG. 3 represents a first algorithm for determining power patterns for controlling the operation of a multi-die power module according to the present invention.

The present algorithm is disclosed in an example wherein it is executed by the processor 200 of the controller 10.

The present algorithm is for example executed every second or every millisecond.

At step S300, the processor 200 commands the interface 206 in order to obtain a current value provided by the current sensor 15 and memorizes the obtained current.

At next step S301, the processor 200 checks if the obtained current value is different from a previously memorized current value. As example, the obtained current value is different from the previous memorized current value if the difference is more or less than ten percents of the previous memorized current value.

If the obtained current value is different from the previous memorized current value, the processor 200 moves to step S302. Otherwise, the processor 200 returns to step S300.

At step S302, the processor 200 determines the switching energy loss $E_{sw,N}$ in a die when all dies of the multi-die power module 20 are activated and the switching energy loss $E_{sw,N-1}$ in a die when a single other die is not activated in the multi-die power module 20.

The switching losses are dependent of the current flowing through the dies $D_1$ to $D_8$. For a given total current I measured at step S300, the current flowing through an activated die is a function of the number of activated dies in the multi-die power module 20. An example of dependency of switching losses with current flowing in a die is given in FIG. 4.

Figure 4:
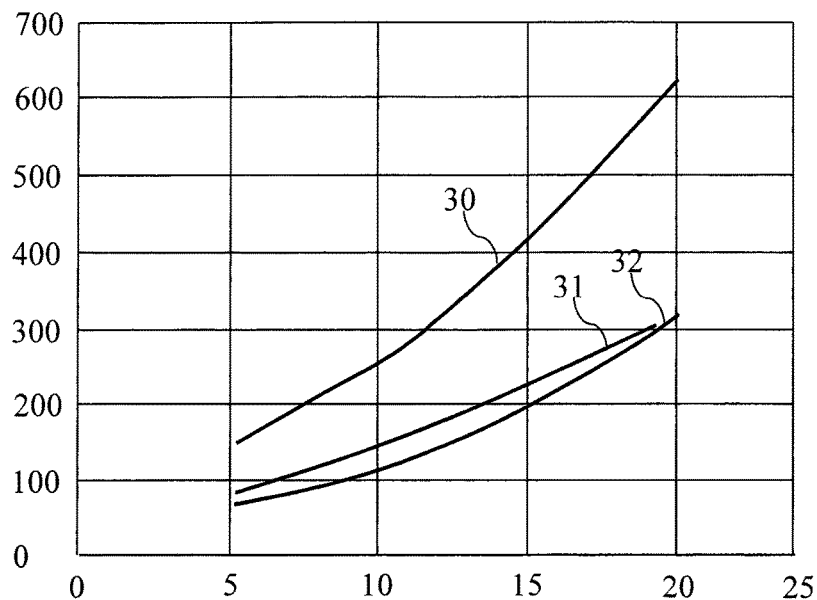
FIG. 4 represents an example of variation of switching energy of a die according to a peak drain current going through the die.

FIG. 4 represents an example of variation of switching energy of a die according to a peak drain current going through the die.

The horizontal axis represents the peak drain current of a die in Amperes and the vertical axis represents the switching energy loss in milli Joule.

The curve noted 30 represents the total switching losses, the curve noted 31 represents the turn-off switching losses dissipated by the die when the die switches from conducting state to non-conducting state and the curve noted 32 represents the turn-on switching losses dissipated by the die when the die switches from non-conducting state to conducting state.

The values given by the curve 30 are for example stored in a lookup table in the ROM memory 202.

From the obtained current value, the processor 200 determines, from the current value measured at step S300, the switching loss of a die per switching cycle $E_{sw,N}$ traversed by a current equal to I/N where N is the number of activated dies of the multi-die power module 20 as: $E_{sw,N}=aI/N+b(I/N)^2$, where a and b are derived from the curve 30. As example, curve 30 in FIG. 4 may be represented using a=25 and b=0.25.

At next step S303, the processor 200 commands the interface 206 in order to obtain a temperature value provided by the temperature sensor 35 if there is one.

At next step S304, the processor 200 determines the conduction losses $E_{con,N}$ of a die of the multi-die power module 20 when all dies of the multi-die power module 20 are activated, and the conduction losses $E_{con,N-1}$ in a die when a single other die is not activated in the multi-die power module 20, using the current value obtained at step S300 and, according to a particular mode of realization, using the obtained temperature value.

The conduction losses are dependent of the current flowing through the dies $D_1$ to $D_8$. An example of such dependency is given in FIG. 5.

Figure 5:
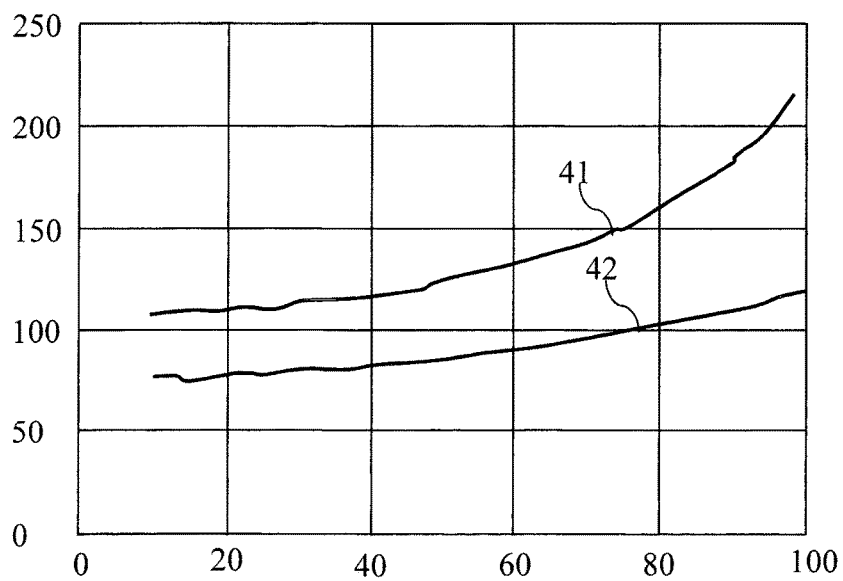
FIG. 5 represents an example of drain to source resistance according to a drain current going through the die.

FIG. 5 represents an example of drain to source resistance according to a drain current flowing through the die.

The horizontal axis represents the peak drain current of a die in Amperes and the vertical axis represents the series resistance of the die expressed in milli Ohm.

The curve noted 41 represents the series resistance of the die at a temperature of 135 degrees Celcius and the curve noted 42 represents the series resistance of the die at a temperature of 25 degrees Celcius.

The values given by the curves 41 and 42 are for example stored in a lookup table in the ROM memory 202.

From the obtained current value, the processor 200 determines the conduction loss per cycle of a die traversed by a current equal to 1/N, reflecting that only partial passivation is used as $$E_{con,N} = \frac{x}{f_{sw}}(c(I/N)+d(I/N)^2).$$

A die is partially passivated when its switching pattern is modified so that the die does not contribute to the switching losses, but yet contributes to the conducting losses. This is realised when the partially passivated die switches on once the turn-on of other dies is completed, and when the other dies switch off once the turn-off of the die is completed.

c and d are derived from the current measured at step S301, the temperature measured at step S303 and from the values stored in the lookup table.

x is the duty cycle of the input control signal to be applied to the multi-die power module 20 and $f_{sw}$ is the frequency of the input control signal to be applied to the multi-die power module 20.

From the obtained current value, the processor 200 determines the conduction loss per cycle of a die traversed by a current equal to I/N-1, reflecting that full passivation is used for one die, as $$E_{con,N-1} = \frac{x}{f_{sw}}(c(I/(N-1))+d(I/(N-1))^2)$$

It has to be noted here that for IGBT dies, the conduction loss may be expressed as $$E_{con} \sim \frac{x}{f_{sw}}V_{ce}I/N,$$

while for MOSFET dies, $$E_{con} \sim \frac{x}{f_{sw}}R_{dson}(I/N)^2.$$

Partial passivation of a die constitutes delay or advance of the commutation from the switching pattern, whereby the die is commutated at low voltage conditions like close to the saturation state of the neighbouring dies. The passivated die thus experiences zero switching losses while conduction losses are still attributable to the passivated die.

Full passivation of a die constitutes strobing out the respective pulse from the switching pattern of the Drive Signal, whereby no switching nor conduction losses are attributable to the die.

As example, if temperature measured at step S303 is 70 degrees Celcius and if current measured at step S300 is 100 Amperes, then series resistance $R_{dson}$ of the MOSFET die is estimated 175 milli-Ohm using interpolation of values stored in the lookup table. In this example, c is determined as 0 and value d is determined as 0.175 Ohm.

As other example, the collector-emitter voltage $V_{CE}$ of IGBT dies is estimated using direct measurement or using interpolation of values stored in the lookup table at temperature measured at step S303.

At next step S305, the processor 200 determines a matrix $M_I$ that reflects the relation between passivation ratios of dies $D_1$ to $D_8$ and the powers dissipated by the dies $D_1$ to $D_8$.

According to a particular feature, deactivated dies are only partially deactivated, meaning that they always all contribute to the conduction losses, and the matrix $M_I$ is determined as:

$$M_I = E_{sw,N} \begin{bmatrix} 1 & 0 & 0 & 0 & 0 & 0 & 0 & 0 \\ 1 & 0 & 0 & 0 & 0 & 0 & 0 & 0 \\ 1 & 0 & 0 & 0 & 0 & 0 & 0 & 0 \\ 1 & 0 & 0 & 0 & 0 & 0 & 0 & 0 \\ 1 & 0 & 0 & 0 & 0 & 0 & 0 & 0 \\ 1 & 0 & 0 & 0 & 0 & 0 & 0 & 0 \\ 1 & 0 & 0 & 0 & 0 & 0 & 0 & 0 \\ 1 & 0 & 0 & 0 & 0 & 0 & 0 & 0 \end{bmatrix} +$$

$$E_{sw,N-1} \begin{bmatrix} 0 & 1 & 1 & 1 & 1 & 1 & 1 & 1 \\ 0 & 0 & 1 & 1 & 1 & 1 & 1 & 1 \\ 0 & 1 & 0 & 1 & 1 & 1 & 1 & 1 \\ 0 & 1 & 1 & 0 & 1 & 1 & 1 & 1 \\ 0 & 1 & 1 & 1 & 0 & 1 & 1 & 1 \\ 0 & 1 & 1 & 1 & 1 & 0 & 1 & 1 \\ 0 & 1 & 1 & 1 & 1 & 1 & 0 & 1 \\ 0 & 1 & 1 & 1 & 1 & 1 & 1 & 0 \end{bmatrix} + E_{con,N} \begin{bmatrix} 1 & 1 & 1 & 1 & 1 & 1 & 1 & 1 \\ 1 & 1 & 1 & 1 & 1 & 1 & 1 & 1 \\ 1 & 1 & 1 & 1 & 1 & 1 & 1 & 1 \\ 1 & 1 & 1 & 1 & 1 & 1 & 1 & 1 \\ 1 & 1 & 1 & 1 & 1 & 1 & 1 & 1 \\ 1 & 1 & 1 & 1 & 1 & 1 & 1 & 1 \\ 1 & 1 & 1 & 1 & 1 & 1 & 1 & 1 \\ 1 & 1 & 1 & 1 & 1 & 1 & 1 & 1 \end{bmatrix}$$

Where $E_{sw,N}$, $E_{sw,N-1}$ were computed at step S302 and $E_{con,N}$ was computed at step S304.

The matrix $M_I$ is built assuming that dies are passivated in sequence, i.e. only one die being deactivated at each activation cycle. In above example, the first column of matrix $M_I$ is different from other columns by construction, as it is assumed that the first die $D_1$ is never passivated. As example, the first die corresponds to a die close to the cooling system of the multichip power module 20. The corresponding passivation ratio indicates the ratio of activation cycles where no die is passivated.

The matrix $M_I$ being built from canonic matrices, its determination for a larger or smaller number of dies is straightforward.

According to a particular feature, plural matrices $M_I$ are stored in the RAM memory 203, one matrix for one value of current.

The processor 200, using the current value obtained at step S300, reads in the RAM memory 203 the matrix which corresponds to the obtained value of current.

At step S306, the processor 200 obtains from the RAM memory 203 a loss profile vector Q that is representative of loss distribution within the multi-die power module 20 and is determined through measurements and/or simulations during the design of the multi-die power module 20 and/or using the cooling parameters to the use in the operation of the multi die power module 20.

According to a variant of invention, the loss profile vector Q is received from the Input/Output interface 204 prior to being stored in the RAM memory 203. As the ideal loss profile, able to achieve the balancing of temperature of the power dies $D_1$ to $D_8$, may depend on the design or the configuration of an external cooling system not represented in FIG. 1, the loss profile vector Q may be configured by a remote/online programming or may be generated at manufacture for feeding a calibrated loss profile.

According to another variant of invention, the loss profile vector Q is determined by processor 200 according to algorithm disclosed in FIG. 7.

At next step S307, the processor 200 determines a vector n of passivation ratios. For each die, the passivation ratio n indicates the amount of switching cycles where the die shall be passivated compared to the total number $N_c$ of consecutive switching cycles. When the ratio is zero, the die is not passivated, when the ratio is one, the die is always passivated.

A high passivation ratio indicates that the contribution of the die to the losses should be reduced. This can be realised by passivating the die during the switching transients of some switching cycles.

In this example, the vector n consists of a number $n_1$ of switching cycles without any die passivation, followed by a series of numbers $n_k$ of switching cycles, during which the $k^{th}$ die is partially passivated, k=2 to N. The losses then express as an algebraic formula:

$$M_I n = N_c Q$$

For k=1, $n_1$ represents the number of cycles where no die is passivated. In this example, the first die is never passivated.

The processor 200 determines the vector n as:

$$n \propto M_I^{-1} Q, \text{sum}(n) = N_c$$

According to a particular feature, the vector n is determined as follows:

$$n \propto A^{-1}(Q - E_{con}) \text{ where } A = \begin{bmatrix} 1 & 0 & 0 & 0 & 0 & 0 & 0 & 0 \\ 1 & 0 & 0 & 0 & 0 & 0 & 0 & 0 \\ 1 & 0 & 0 & 0 & 0 & 0 & 0 & 0 \\ 1 & 0 & 0 & 0 & 0 & 0 & 0 & 0 \\ 1 & 0 & 0 & 0 & 0 & 0 & 0 & 0 \\ 1 & 0 & 0 & 0 & 0 & 0 & 0 & 0 \\ 1 & 0 & 0 & 0 & 0 & 0 & 0 & 0 \\ 1 & 0 & 0 & 0 & 0 & 0 & 0 & 0 \end{bmatrix} +$$

$$\frac{N}{N-1} \begin{bmatrix} 0 & 1 & 1 & 1 & 1 & 1 & 1 & 1 \\ 0 & 0 & 1 & 1 & 1 & 1 & 1 & 1 \\ 0 & 1 & 0 & 1 & 1 & 1 & 1 & 1 \\ 0 & 1 & 1 & 0 & 1 & 1 & 1 & 1 \\ 0 & 1 & 1 & 1 & 0 & 1 & 1 & 1 \\ 0 & 1 & 1 & 1 & 1 & 0 & 1 & 1 \\ 0 & 1 & 1 & 1 & 1 & 1 & 0 & 1 \\ 0 & 1 & 1 & 1 & 1 & 1 & 1 & 0 \end{bmatrix}$$

According to a particular feature, the matrix $M_I$ is pre-computed in a lookup table for a variety of currents and temperature conditions.

At next step S308, the processor 200 checks if at least one element of the vector n is negative. One element of the vector n may become negative when switching losses are not strong enough to compensate the thermal imbalance only with a modulation of switching losses among dies.

If at least one element of the vector n is negative, the processor 200 moves to step S309. Otherwise, the processor 200 moves to step S310.

At step S309, the processor 200 determines a new matrix $M_I$ that reflects the relation between passivation ratios of dies $D_1$ to $D_8$ and the powers dissipated by the dies $D_1$ to $D_8$ when at least one die is fully passivated, meaning that when the at least one die is fully passivated, it does not contribute to both the switching and to the conduction losses during the passivated switching cycle.

Assuming that the fifth element of the vector n determined at step S307 is negative, the processor 200 determines a new matrix $M_f$ that reflects that the fifth power die $D_5$ is fully passivated:

$$M_f = E_{sw,N}\begin{bmatrix}1&0&0&0&0&0&0&0\\1&0&0&0&0&0&0&0\\1&0&0&0&0&0&0&0\\1&0&0&0&0&0&0&0\\1&0&0&0&0&0&0&0\\1&0&0&0&0&0&0&0\\1&0&0&0&0&0&0&0\\1&0&0&0&0&0&0&0\end{bmatrix}+E_{sw,N-1}\begin{bmatrix}0&1&1&1&1&1&1&1\\0&0&1&1&1&1&1&1\\0&1&0&1&1&1&1&1\\0&1&1&0&1&1&1&1\\0&1&1&1&0&1&1&1\\0&1&1&1&1&0&1&1\\0&1&1&1&1&1&0&1\\0&1&1&1&1&1&1&0\end{bmatrix}+$$

$$E_{con,N}\begin{bmatrix}1&1&1&1&0&1&1&1\\1&1&1&1&0&1&1&1\\1&1&1&1&0&1&1&1\\1&1&1&1&0&1&1&1\\1&1&1&1&0&1&1&1\\1&1&1&1&0&1&1&1\\1&1&1&1&0&1&1&1\\1&1&1&1&0&1&1&1\end{bmatrix}+E_{con,N-1}\begin{bmatrix}0&0&0&0&1&0&0&0\\0&0&0&0&1&0&0&0\\0&0&0&0&1&0&0&0\\0&0&0&0&1&0&0&0\\0&0&0&0&0&0&0&0\\0&0&0&0&1&0&0&0\\0&0&0&0&1&0&0&0\\0&0&0&0&1&0&0&0\end{bmatrix}$$

The matrix $M_f$ being built from canonic matrices, its determination for a larger or smaller number of fully passivated dies is straightforward.

After that, the processor 200 returns to step S307.

At step S310, the processor 200 applies the vector n to $N_c$ consecutive switching cycles of input control signal to be applied to the multi-die power module 20. The $n_k$ cycles are successively applied or may be interleaved. The Gate to Source voltage signals are all identical to the input control signal, except during the number $n_k$ of switching cycles during which the $k^{th}$ die is passivated.

For a given switching cycle belonging to the $n_k$ switching cycles during which the kth die is to be passivated, if full passivation was not identified at step S308, the Gate to Source voltage signal of the $k^{th}$ die is shrinked to activate the die after other dies have completed turn-on, and to complete turn-off of the die prior to switching off the other dies. The die contributes to the conduction losses, but not to the switching losses.

If full passivation was identified at step S308, the Gate to Source voltage signal of the $k^{th}$ die remains in low voltage state. No current flows through the kth die during the switching cycle.

FIG. 6 represents a second algorithm for determining power patterns for controlling the operation of a multi-die power module according to the present invention.

The present algorithm is disclosed in an example wherein it is executed by the processor 200 of the controller 10.

The present algorithm is for example executed every activation cycle of the input control signal.

At step S600, the processor 200 receives a current value from the current sensor 15.

At next step S601, the processor 200 receives a temperature value from the temperature sensor 35.

At next step S602, the processor 200 determines the losses $L_1$ to $L_8$ of each die of the multi-die power module resulting from the previous activation cycle. The losses are the sum of switching and conduction losses.

When no die was passivated in the previous activation cycle, the losses are estimated to be identical and equal to $E_{sw,N}+E_{con,N}$.

When a die was partially passivated in the previous activation cycle, the loss of the passivated die is estimated as $E_{con,N}$, while the losses of non passivated dies are estimated as $E_{sw,N-1}+E_{con,N}$.

When a die was fully passivated in the previous activation cycle, the loss of the passivated die is estimated zero, while the loss of non passivated dies are estimated as $E_{sw,N-1}+E_{con,N-1}$.

As example, $E_{sw,N}$, $E_{sw,N-1}$, $E_{con,N}$ and $E_{con,N-1}$ are determined from the current value sensed at step S600 and the temperature value sensed at step S601 as described in step S302 of FIG. 3. At next step S603, the processor 200 determines accumulated heat levels $QR_1$ to $QR_8$ of the heat accumulated in each power die $D_1$ to $D_8$. As example, the previous level is incremented by the loss estimated at step S602.

$$QR_x = QR_x + L_x \text{ where } x=1 \text{ to } 8,$$

At next step S604, the processor 200 obtains from the RAM memory 203 a loss profile vector Q that is representative of loss distribution within the multi-die power module 20. The loss profile vector Q is determined through measurements and/or simulations during the design of the multi-die power module 20 and/or using the cooling parameters used in the operation of the multi die power module 20.

According to a variant of invention, the loss profile vector Q is received from the Input/Output interface 204 prior to being stored in the RAM memory 203. As the ideal loss profile able to achieve the balancing of temperature of power dies $D_1$ to $D_8$ may depend on the design or the configuration of an external cooling system not represented in FIG. 1, the loss profile vector Q may be configured by a remote/online programming or may be generated at manufacture for feeding a calibrated loss profile.

According to another variant of the invention, the loss profile vector Q is determined by processor 200 according to algorithm disclosed in FIG. 7 prior to being stored in the RAM memory 203.

At next step S605, the processor 200 determines for each power die $D_1$ to $D_8$ a ratio $R_1$ to $R_8$ between accumulated heat levels $QR_1$ to $QR_8$ and loss $Q_1$ to $Q_8$ indicated by the loss profile vector Q obtained at step S604.

As example, $R_x = QR_x/Q_x * \text{sum}(Q_y)/\text{sum}(QR_y)$ where x,y=1 to 8.

At next step S606, the processor 200 determines which die has the highest ratio among ratios determined at step S605.

At next step S607, the processor 200 determines if the highest ratio determined at step 606 is higher than a predetermined threshold. As example, the threshold equals 1.01. If the highest ratio is lower than the predetermined threshold, the processor 200 moves to step S608. If the highest ratio is higher than the predetermined threshold, the processor 200 moves to step S609.

At step S608, the processor 200 commands the power interface 206 to activate all dies for the next activation cycle of input control signal. No die needs to be passivated as the accumulated heat levels $Q_{R1}$ to $Q_{R8}$ are proportional to losses $Q_1$ to $Q_8$ of loss profile vector Q, required to balance temperature across dies $D_1$ to $D_8$. As a result, temperature of power dies $D_1$ to $D_8$ are balanced.

At Step S609, the processor 200 determines if the die, identified at step S606 as having the highest ratio, was also passivated in the previous activation cycle. If the die identified at step S606 as having the highest ratio was also passivated in the previous activation cycle, the processor 200 moves to step S611. If the die identified at step S606 as having the highest ratio was not passivated in the previous activation cycle, the processor moves to step S610.

At step S610 the processor 200 commands the power interface 206 to partially passivate the die, identified at step S606 as having the highest ratio, for the next activation cycle of the input control signal. The processor 200 also commands the power interface 206 to activate all the other dies not identified at step S606 as having the highest ratio for the next activation cycle of the input control signal.

As the die identified at step S606 as having the highest ratio had an excess of accumulated heat level compared with the loss profile vector Q, the processor 200 decides to passivate that die in order to reduce the excess of accumulated heat level. As a result, the vector of accumulated heat levels $Q_R$ is steered towards the loss profile vector Q required to balance temperature across dies $D_1$ to $D_8$.

At step S611 the processor 200 commands the power interface 206 to fully passivate the die identified at step S606 as having the highest ratio for the next activation cycle of the input control signal. The processor 200 also commands the power interface 206 to activate all the other dies not identified at step S606 as having the highest ratio for the next activation cycle of the input control signal.

As the die identified at step S606 as having the highest ratio had an excess of dissipated heat compared with the vector Q, the processor 200 decides to passivate that die in order to reduce the excess of accumulated heat. As a result, the vector of accumulated heats $Q_R$ is steered towards the vector Q required to balance temperature across dies $D_1$ to $D_8$. The steering is accelerated by use of full passivation instead of partial passivation. The steering is realised in any current waveform conditions.

FIG. 7 represents an algorithm for determining loss profile Q.

The present algorithm is disclosed in an example wherein it is executed by the processor 200 of the controller 10.

The present algorithm is for example executed every second or ms.

At step S700, the processor 200 receives a current value from the current sensor 15.

At step S701, the processor 200 determines if the current value received from the current sensor 15 at step S701 crosses zero. If during an activation cycle of power module, the current value measured at step S700 crosses zero, the processor 200 moves to step S702. If the current value does not cross zero, the processor 200 moves to step S700.

At step S702, the processor 200 determines the frequency of the current waveform. As example, the frequency is determined as half the inverse of time elapsed between two consecutive steps S702.

At next step S703, the processor 200 determines a matrix $M_T$, which relates the losses dissipated by the power dies $D_1$ to $D_8$ with temperature of dies $T_1$ to $T_8$ under steady condition, for a current flowing through the multi-die power module which alternates with the frequency estimated at step S702.

As example, the multi-die power module and its cooling environment define together an equivalent thermal network, including thermal resistance and capacitance, that is stored in RAM memory. The matrix $M_T$ represents the thermal response of the thermal network, which can be determined at different frequencies using conventional circuit analysis techniques.

At next step S704, the processor 200 determines a vector Q of loss profile, required to balance temperature of dies when the current flowing through the multi-die power module is alternating with the frequency determined at step S702. According to the invention, $Q=M_T^{-1} T$, where T is the desired balanced temperature profile.

Naturally, many modifications can be made to the embodiments of the invention described above without departing from the scope of the present invention.

The invention claimed is:

1. Method for controlling the operation of a multi-die power module composed of at least two dies connected in parallel, characterized in that the method comprises:
    obtaining the current flowing in the multi-die power module,
    obtaining a loss profile that is related to the dies of the multi-die power module,
    estimating from the measured current flowing in the multi-die power module, the losses of one die when no die is passivated, when the die is passivated, and when at least one other die is passivated,
    determining if and which die has to be passivated from the estimated losses and from the loss profile, and
    passivating the die which has to be passivated if a die has to be passivated.

2. Method according to claim 1, characterized in that the determining further comprises:
    determining if the die which has to be passivated shall be partially passivated or fully passivated;
    fully passivating the die which has to be passivated by keeping the die in off state if the die which has to be passivated shall be fully passivated; and
    partially passivating the die which has to be passivated by activating the die which has to be passivated during a smaller period than other dies.

3. Method according to claim 1, characterized in that the losses of the die are the sum of the conduction loss and of the switching loss of the die, which are determined from the current flowing in the multi-die power module and from the passivation status of dies of the multi-die power module.

4. Method according to claim 3, characterized in that the switching losses are null if the die is passivated, the conduction losses are null if the die is fully passivated, the switching losses are equally shared across the dies which are not passivated and the conduction losses are equally shared across the dies which are not fully passivated.

5. Method according to claim 1, characterized in that the method comprises further obtaining the temperature of the multi-die power module and in that the estimated losses are further dependent of the obtained temperature.

6. Method according to claim 1, characterized in that the determining if and which die has to be passivated from the estimated losses and from the loss profile further comprises:
    determining a passivation pattern for at least one die from the estimated losses and from the loss profile,
    and in that the passivating the die which has to be passivated is performed according to the determined passivation pattern.

7. Method according to claim 1, characterized in that the method comprises further obtaining a first matrix that relates the losses of dies to the passivation states of the multi-die power module using the estimated losses of one die when no die is passivated, when the die is passivated, and when at least one other die is passivated and in that the passivation pattern is determined from the obtained first matrix and the loss profile.

8. Method according to claim 7, characterized in that the obtained first matrix is obtained from a lookup table stored in a memory.

9. Method according to claim 7, characterized in that the passivation pattern is determined by a vector obtained as the product of the inverse of the first matrix with the loss profile, the k-th component of the obtained vector defining the ratio of activation cycles where the k-th die shall be not passivated.

10. Method according to claim 9, characterized in that if the k-th component of the obtained vector is negative, the method further comprising:
obtaining a second matrix that relates the losses of dies to the passivation states of the multi-die power module, using the estimated losses of one die when no die is passivated, when the die is passivated, and when at least one other die is passivated, the k-th die being fully passivated,
and the passivation pattern is determined from the obtained second matrix and the loss profile.

11. Method according to claim 1, characterized in that the determining if and which die has to be passivated from the estimated losses and from the loss profile further comprises:
memorising the estimated losses and information indicating if the die was previously passivated; and
estimating an accumulation of heat level dissipated by each die of the multi-die power module according to memorised estimated loss and information,
and in that the determining if and which die has to be passivated is performed from the estimated accumulation of heat levels and from the loss profile.

12. Method according to claim 11, characterized in that a ratio between the estimated accumulation of heat level and the loss profile is determined for each die and the die which has the highest ratio is determined as to be passivated if the ratio exceeds a predetermined value.

13. Method according to claim 12, characterized in that the die ratio is determined as to be fully passivated if the ratio exceeds a second predetermined value.

14. Method according to claim 11, characterized in that the loss profile is obtained by determining if the current flowing in the multi-die power module crosses zero and if the current flowing in the multi-die power module crosses zero, the method further comprising:
determining a third matrix, which relates the losses of the dies to the temperature of the dies, the matrix being dependent of the current flowing in the multi-die power module and the frequency of the crossing of the current flowing in the multi-die power module to zero and the loss profile is obtained by determining a vector of loss profile according to the third matrix and a balanced temperature profile.

15. Device for controlling the operation of a multi-die power module composed of at least two dies connected in parallel, characterized in that the device comprises:
a processor to execute a program; and
a memory to store the program which, when executed by the processor, performs processes of,
obtaining the current flowing in the multi-die power module,
obtaining a loss profile that is related to the dies of the multi-die power module,
estimating from the measured current flowing in the multi-die power module, the losses of one die when no die is passivated, when the die is passivated, and when at least one other die is passivated,
determining if and which die has to be passivated from the estimated losses and from the loss profile, and
passivating the die which has to be passivated if a die has to be passivated.

* * * * *